(12) United States Patent
Vinson et al.

(10) Patent No.: US 7,218,515 B2
(45) Date of Patent: May 15, 2007

(54) COOLING FAN WITH EXTERNAL CIRCUIT BOARD

(75) Inventors: Wade D. Vinson, Magnolia, TX (US); John P. Franz, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 62 days.

(21) Appl. No.: 11/132,570

(22) Filed: May 19, 2005

(65) Prior Publication Data

US 2006/0262499 A1  Nov. 23, 2006

(51) Int. Cl.
*G06F 1/20* (2006.01)
(52) U.S. Cl. .................. 361/687; 417/423.1; 165/121; 62/259.2
(58) Field of Classification Search ........ 361/679–687, 361/724–727, 695, 697; 417/423.1, 423.2; 165/185, 121; 62/3.2, 3.7, 259.2
See application file for complete search history.

(56) References Cited

U.S. PATENT DOCUMENTS

| | | | |
|---|---|---|---|
| 5,099,181 A | * | 3/1992 | Canon ......................... 318/254 |
| 5,421,402 A | | 6/1995 | Lin |
| 5,676,199 A | | 10/1997 | Lee |
| 6,525,938 B1 | | 2/2003 | Chen |
| 6,798,659 B2 | * | 9/2004 | Chen .......................... 361/697 |
| 6,924,979 B2 | * | 8/2005 | Clements et al. ........... 361/695 |
| 2002/0094282 A1 | | 7/2002 | Bendikas et al. |
| 2003/0019646 A1 | | 1/2003 | Clements et al. |
| 2004/0165355 A1 | | 8/2004 | Chen |
| 2005/0186096 A1 | * | 8/2005 | Vinson et al. ........... 417/423.1 |

* cited by examiner

*Primary Examiner*—Hung Van Duong

(57) ABSTRACT

A cooling fan comprising a housing, an electric motor, a blade assembly, and a first motor control circuit board. The housing is operable to connect to a computer chassis that supports an electronic component. An electric motor is fixably mounted within a volume formed by an inner surface of the housing. A blade assembly is rotatably mounted to the electric motor. A first motor control circuit board is coupled to the electric motor and is disposed externally to the volume formed by the inner surface of said housing.

20 Claims, 4 Drawing Sheets

COOLING FAN WITH EXTERNAL CIRCUIT BOARD

BACKGROUND

Computer systems include numerous electrical components that draw electrical current to perform their intended functions. For example, a computer's microprocessor or central processing unit ("CPU") requires electrical current to perform many functions such as controlling the overall operations of the computer system and performing various numerical calculations. Generally, any electrical device through which electrical current flows produces heat. The amount of heat any one device generates generally is a function of the amount of current flowing through the device.

Typically, an electrical device is designed to operate correctly within a predetermined temperature range. If the temperature exceeds the predetermined range (i.e., the device becomes too hot), the device may not function correctly, thereby potentially degrading the overall performance of the computer system. Thus, many computer systems include cooling systems to regulate the temperature of their electrical components. One type of cooling system is a forced air system that relies on one or more cooling fans to blow air over the electronic components in order to cool the components.

The cubic feet per minute ("CFM") of air that can be moved across an electric device is an important factor in how much heat can be removed from the device. Thus, the capacity of a cooling fan is a critical factor in selecting an air mover for use in a cooling application. The CFM that a cooling fan can produce is governed a number of factors including: the total area of the blades generating the airflow, the free area provided for airflow through the fan, the design of the blades, and the power generated by the electric motor.

Miniature brushless DC electric motors are used to power many cooling fans used in electronic cooling applications. These electric motors utilize a cylindrical windings section with magnets disposed inside or outside the cylinder. As electrical current flows through the windings, the magnets rotate about the axis of the motor. A variety of electrical circuitry and components are used to facilitate the operation of the motor by managing the current supplied to the cylindrical windings. Common to all brushless DC motors is commutation circuitry that directs the supply of current to the windings. In standard brushless DC fans, commutation circuitry is mounted within the fan housing.

In many computer cooling applications, the size of a cooling fan is constrained by the chassis supporting the computer system. Limiting the size of a cooling fan often limits the performance of the fan because the power generated by an electric motor is partially dependent on the size of the motor. Therefore, as the size of the motor decreases, so does the power that can be generated by the motor.

BRIEF SUMMARY

The problems noted above are solved in large part by a cooling fan comprising a housing, an electric motor, a blade assembly, and a first motor control circuit board. The housing is operable to connect to a computer chassis that supports an electronic component. An electric motor is fixably mounted within a volume formed by an inner surface of the housing. A blade assembly is rotatably mounted to the electric motor. A first motor control circuit board is coupled to the electric motor and is disposed externally to the volume formed by the inner surface of the housing.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1:
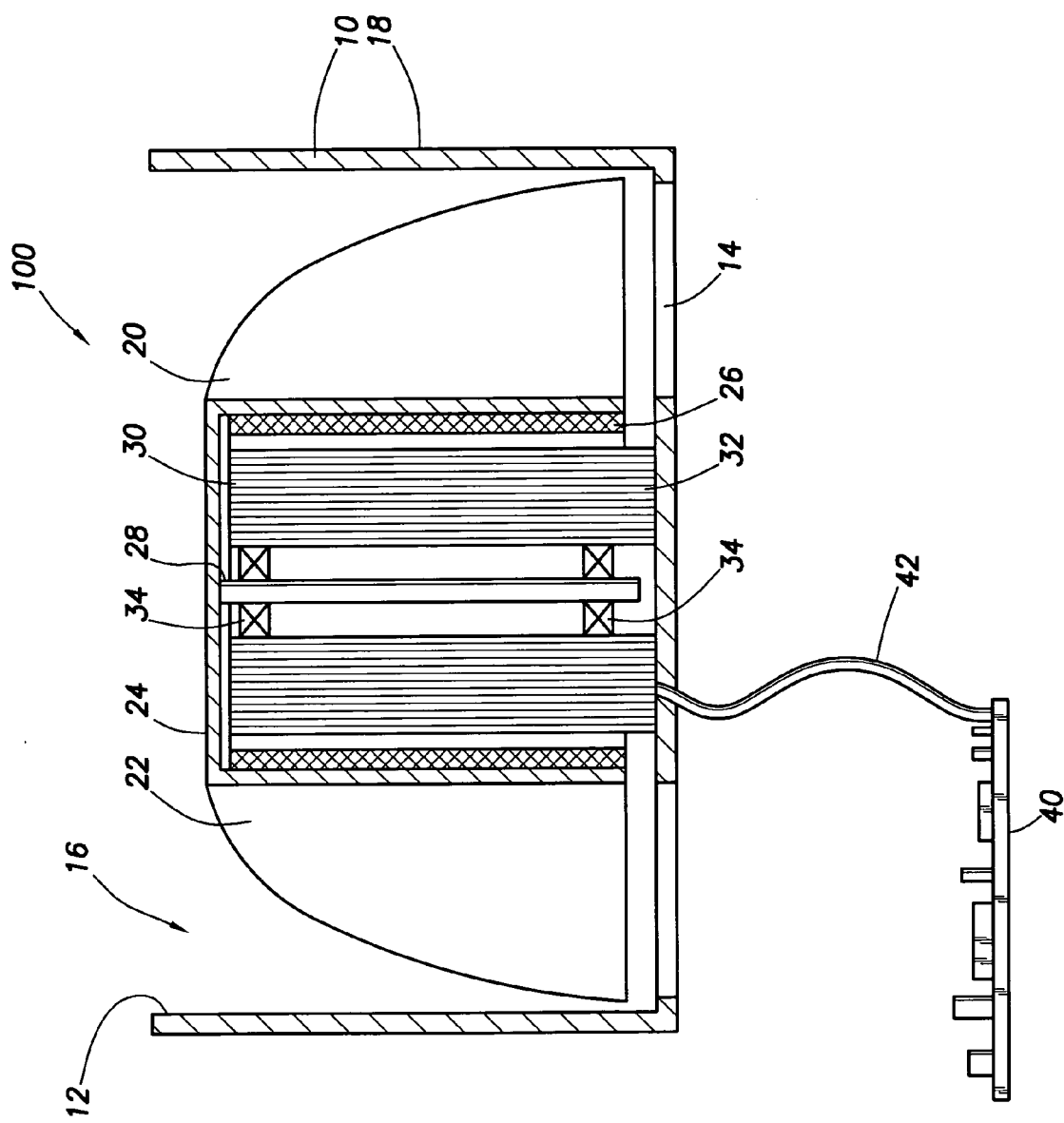
FIG. 1 shows a sectional view of an air mover constructed in accordance with embodiments of the invention.

Referring now to FIG. 1, cooling fan 100 comprises housing 10, blade assembly 20, motor 30, and motor control circuit board 40. Blade assembly 20 and motor 30 are mounted within a volume 16 formed the inner surface 12 of housing 10. This rotation generates airflow through housing 10. Housing 10 comprises inner surface 12 that forms a substantially cylindrical volume 16, struts 14 that connect motor 30 to the housing, and outer surface 18. Blade assembly 20 comprises blades 22 extending from hub 24. Magnets 26 are positioned on the inside surface of hub 24. In certain embodiments, the magnets may alternatively be coupled to shaft 28. Shaft 28 is centered within, and coupled to, hub 24. Motor 30 comprises windings 32 and bearings 34.

Motor 30 is fixably mounted to housing 10. Blade assembly 20 is rotatably mounted to motor 30. Electrical control signals provided to motor 30 from motor control circuit board 40 causes an electrical current to flow through the motor. The interaction of motor 30 and magnets 26 cause blade assembly 20 to rotate within housing 10. The rotation of blade assembly 20 creates an airflow through volume 16.

Motor control circuit board 40 is disposed externally to volume 16 and is coupled to motor 30 via electrical connections 42. By removing motor control circuit board 40 from housing 10, additional space within the housing is available and can be used to increase the size of the motor components, such as the windings 32, magnets 26, and bearings 34. As the size of windings 32 increases so does the power motor 30 can generate.

Removing motor control circuit board 40 also allows the use of larger circuit boards not limited in size by housing 10. This allows for the use of larger components on the circuit boards, which are often cheaper. Larger circuit boards also allow electrical circuit designers more space for constructing efficient circuits. In other embodiments, the circuit board used to control a fan may be built into the motherboard or into a fan control board that is coupled to a plurality of fans. In these embodiments, a fan assembly would not include a circuit board.

Figure 2:
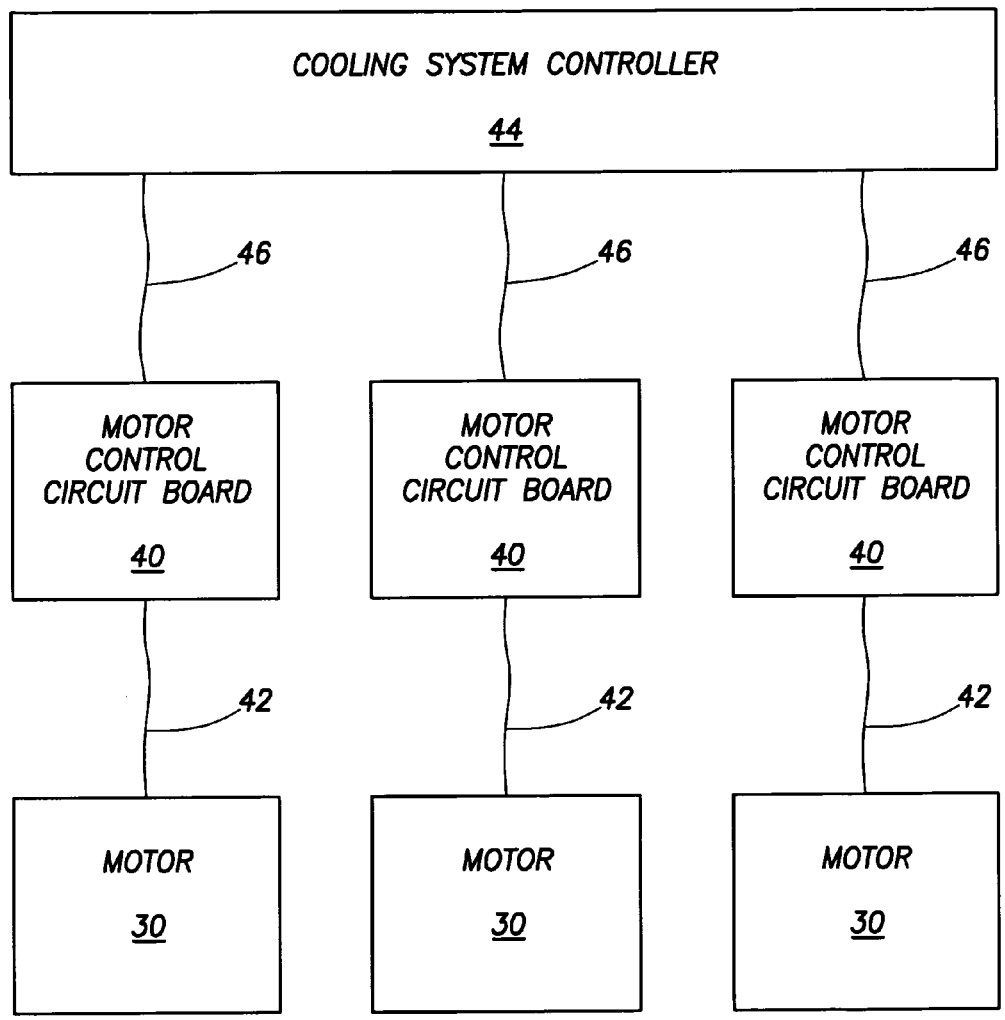
FIG. 2 shows a schematic view of the electrical components of an air mover constructed in accordance with embodiments of the invention.

Referring now to FIG. 2, the electrical system that operates fan motor 30 comprises motor control circuit board 40 and cooling system controller 44. Motor control circuit board 40 comprises the electrical circuits that control the supply of electrical signals to motor 30. Cooling system controller 44 comprises the electrical circuits and sensors that monitor the status of the computer system and operate one or more cooling fans to generate airflow to cool the system. Motor control circuit board 40 is coupled to motor 30 via electrical connections 42. Motor control circuit board 40 is coupled to cooling system controller 44 via electrical connections 46.

Motor control circuit board 40 comprises electrical circuits and components such as commutation circuitry, position decoders, oscillators, current drivers, and other circuits and components used to direct electrical signals to the windings of motor 30. Each motor 30 has a dedicated motor control circuit board 40 coupled thereto. Cooling system controller 44 comprises sensors and electrical circuits that monitor the operation and temperature of the computer system and control the operation of one or more motors 30. Cooling system controller 44 comprises components and circuitry such a speed controllers and temperature sensors.

Figure 3:
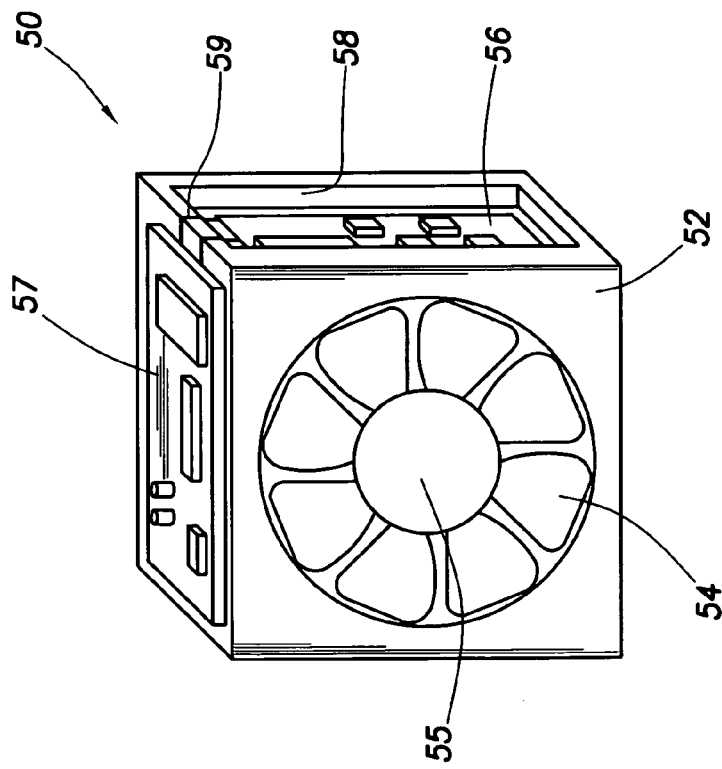
FIG. 3 shows an isometric view of an air mover constructed in accordance with embodiments of the invention.

Referring now to FIG. 3, cooling fan 50 comprises housing 52, blade assembly 54, and motor control circuit board 56. Housing 52 has a substantially rectangular outer perimeter. Blade assembly 54, including a motor 55, is located inside housing 52. Motor control circuit board 56 is mounted to the outside of housing 52. Motor control circuit board 56 may be mounted in a recess 58 and coupled to motor 55 via electrical conductors 59.

In certain embodiments, cooling fan 50 may also comprise a secondary motor control circuit board 57 that is coupled to motor control circuit board 56 and mounted on a different side of the outer surface. The electrical circuitry that controls motor 55 can be placed on both motor control circuit boards 56 and 57, thus allowing greater flexibility in the design of the circuit boards.

Figure 4:
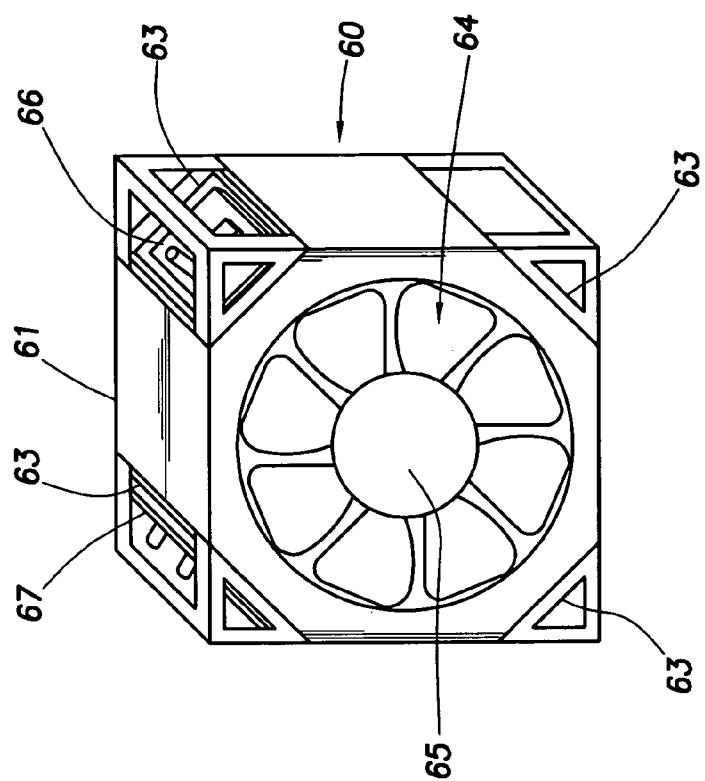
FIG. 4 shows an isometric view of an air mover constructed in accordance with embodiments of the invention.

Referring now to FIG. 4, cooling fan 60 comprises housing 62, blade assembly 64, and motor control circuit board 66. Housing 62 has an rectangular outer perimeter 61 and recessed surfaces 63. Blade assembly 64, including a motor 65, is located inside housing 62. Motor control circuit board 66 is mounted to recessed surfaces 63 within rectangular outer perimeter 61.

Motor control circuit board 66 may be constructed in multiple pieces such that a circuit board is mounted on more than one side of housing 62. For example, cooling fan 60 may also comprise a secondary motor control circuit board 67 that is coupled to motor control circuit board 66. Both motor control circuit boards may be mounted on recessed surfaces 63. The electrical circuitry that controls motor 65 can be placed on both motor control circuit boards 66 and 67, thus allowing greater flexibility in the design of the motor control circuit boards.

Figure 5:
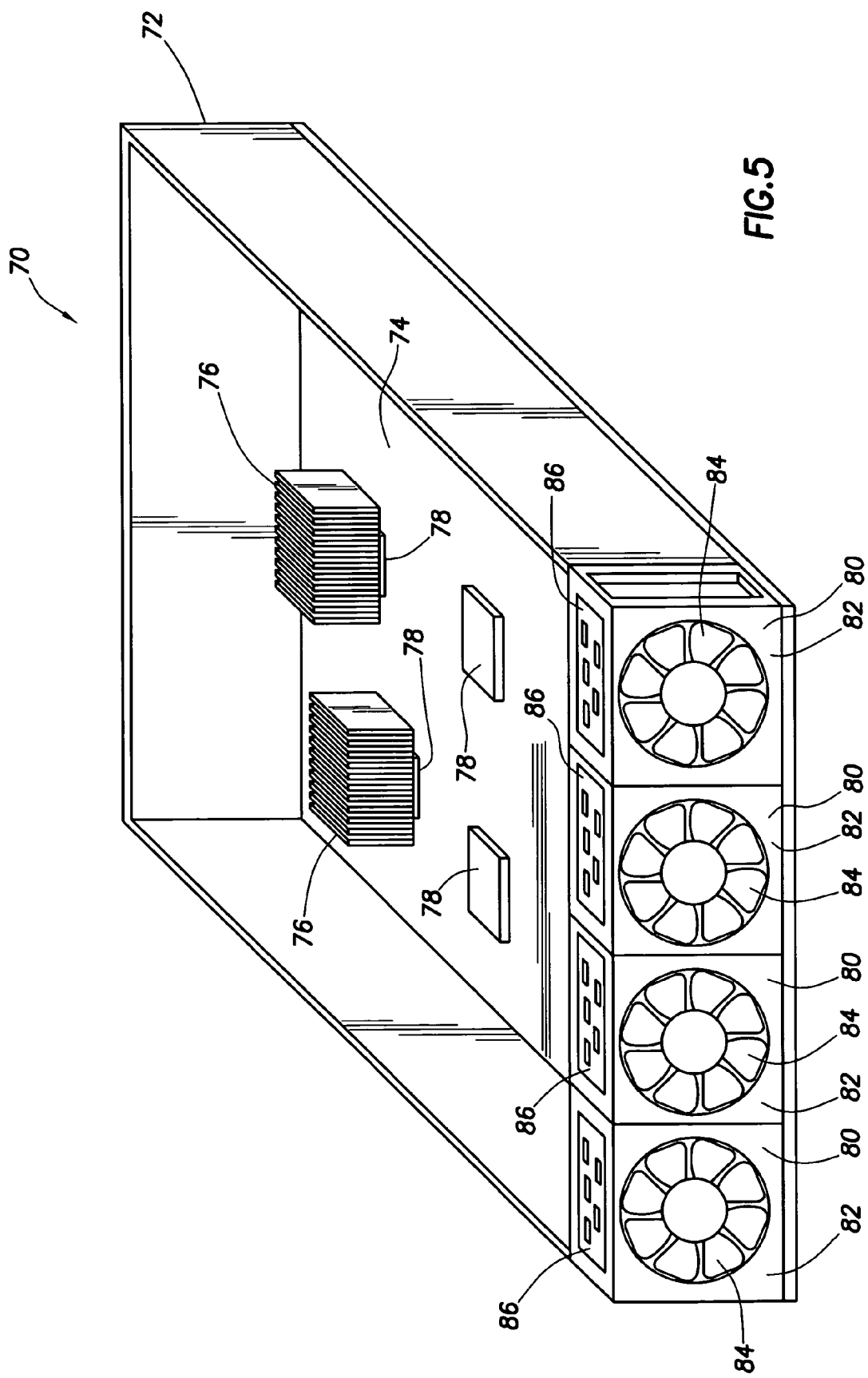
FIG. 5 shows an isometric view of a computer assembly with air movers constructed in accordance with embodiments of the invention.

Referring now to FIG. 5, a computer assembly 70 comprises chassis 72, motherboard 74, heat sinks 76, electronic components 78, and cooling fans 80. Each cooling fan 80 comprises housing 82, blade assembly 84, and motor control circuit board 86. Motor control circuit boards 86 are mounted to the outside of housings 82 so as to allow greater room within the housing for the motor windings, to allow the design and construction of the circuit boards to be optimized, and eliminate restrictions on the airflow.

Cooling fans 80 are arranged so as to generate an airflow that cools electronic component 78. Heat sinks 76 may be arranged so as to be directly in the airflow generated by fans 80. Heat sinks 76 are coupled to electronic components so that the heat generated by the electronic component is dissipated to the airflow through the increased surface area of the heat sink.

The above discussion is meant to be illustrative of the principles and various embodiments of the present invention. Numerous variations and modifications will become apparent to those skilled in the art once the above disclosure is fully appreciated. For example, the circuit board that provides control signals to the cooling fan motor may be located in any position outside of the inner volume of the housing or may be removed from the fan assembly entirely and located on a separate circuit board or incorporated as a component of a centralized fan control system, or located on motherboard 74. It is intended that the following claims be interpreted to embrace all such variations and modifications.

What is claimed is:

1. A cooling fan comprising:
   a housing comprising an inner surface and an outer surface, wherein said housing is operable to connect to a computer chassis that supports an electronic component;
   a brushless DC electric motor fixably mounted within a volume formed by the inner surface of said housing, wherein said electric motor comprises a plurality of windings;
   a blade assembly rotatably mounted to said electric motor; and
   a first motor control circuit board coupled to said electric motor and disposed externally to the volume formed by the inner surface of said housing, wherein said first motor control circuit board comprises circuitry that directs current to the windings of said electric motor.

2. The cooling fan of claim 1 wherein said first motor control circuit board is mounted to the outer surface of said housing.

3. The cooling fan of claim 1 further comprising a second motor control circuit board coupled to said first motor control circuit board and disposed outside of the volume formed by the inner surface of said housing.

4. The cooling fan of claim 3 wherein the outer surface forms a rectangular perimeter and said first and second motor control circuit boards are mounted within the rectangular perimeter.

5. The cooling fan of claim 3 wherein said first and second motor control circuit boards comprise commutation circuitry.

6. The cooling fan of claim 4 wherein said first and second motor control circuit boards are mounted on different sides of the perimeter.

7. A computer system comprising:
a chassis;
an electronic component disposed within said chassis; and
a cooling fan disposed within said chassis, wherein said cooling fan comprises:
  a blade assembly and a brushless DC electric motor disposed within a housing;
  a first motor control circuit board coupled to said electric motor and disposed outside of the housing; and
  an electrical connection directly coupling said first motor control circuit board to the electric motor.

8. The computer system of claim 7 wherein said cooling fan is operable to generate an airflow that cools said electronic component.

9. The computer system of claim 7 wherein said blade assembly and said electric motor are disposed within a volume formed by an inner surface of the housing.

10. The computer system of claim 7 further comprising a second motor control circuit board coupled to said first motor control circuit board and disposed outside of said housing.

11. The computer system of claim 8 further comprising a heat sink thermally coupled to said electronic component, wherein said heat sink is positioned within the airflow generated by said cooling fan.

12. The computer system of claim 9 wherein said first motor control circuit board is mounted to an outer surface of said housing.

13. The computer system of claim 10 wherein the outer surface forms a rectangular perimeter and said first and second motor control circuit boards are mounted inside the rectangular perimeter.

14. The computer system of claim 10 wherein said first and second motor control circuit boards comprise commutation circuitry.

15. The computer system of claim 13 said first and second motor control circuit boards are mounted on different sides of the perimeter.

16. A cooling fan comprising:
a housing operable to be connected to a computer system chassis that supports an electronic component;
means for mounting an electric motor within a volume formed by an inside surface of said housing;
means for rotatably connecting a blade assembly to said electric motor; and
means for mounting a first motor control circuit board to an outer surface of said housing, wherein the first motor control circuit board is directly coupled to the electric motor via an electrical connection.

17. The cooling fan of claim 16 further comprising means for mounting a second motor control circuit board to an outer surface of said housing, wherein the second motor control circuit board is coupled to said first motor control circuit board.

18. The cooling fan of claim 17 wherein said first and second motor control circuit boards comprise commutation circuitry.

19. The cooling fan of claim 17 wherein the outer surface of said housing forms a rectangular perimeter and the first and second motor control circuit boards are mounted inside the rectangular perimeter.

20. The cooling fan of claim 17 wherein the first and second motor control circuit boards are mounted on different sides of the rectangular perimeter.

* * * * *